United States Patent
Okumura

(10) Patent No.: US 11,631,668 B2
(45) Date of Patent: Apr. 18, 2023

(54) CURRENT CONCENTRATION-SUPPRESSED ELECTRONIC CIRCUIT, AND SEMICONDUCTOR MODULE AND SEMICONDUCTOR APPARATUS CONTAINING THE SAME

(71) Applicant: FUJI ELECTRIC CO., LTD., Kawasaki (JP)

(72) Inventor: Keiji Okumura, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 273 days.

(21) Appl. No.: 17/085,696

(22) Filed: Oct. 30, 2020

(65) Prior Publication Data
US 2021/0193651 A1 Jun. 24, 2021

(30) Foreign Application Priority Data
Dec. 23, 2019 (JP) .............................. JP2019-232117

(51) Int. Cl.
*H01L 27/08* (2006.01)
*H01L 23/64* (2006.01)
(Continued)

(52) U.S. Cl.
CPC ...... *H01L 27/0814* (2013.01); *H01L 23/5386* (2013.01); *H01L 23/645* (2013.01); *H01L 29/1608* (2013.01)

(58) Field of Classification Search
CPC ............... H01L 23/5386; H01L 23/645; H01L 29/1608; H01L 23/057; H01L 23/24; H01L 23/3735; H01L 23/49811; H01L 2224/45014; H01L 2224/4903; H01L 24/49; H01L 2224/48464; H01L 24/48; H01L 2224/0603; H01L 2224/48091; H01L 2224/48139; H01L 2224/49052; H01L 2224/49111; H01L 2224/49113; H01L 2924/00014; H01L 2924/1203; H01L 2924/13055; H01L 2924/19107; H01L 25/18; H01L 25/072; H01L 23/49; H01L 27/0814; H02M 7/003; H02M 7/48
(Continued)

(56) References Cited

U.S. PATENT DOCUMENTS

| | | | | |
|---|---|---|---|---|
| 2008/0043500 A1* | 2/2008 | Asano | .................... | H02M 1/34 363/56.12 |
| 2009/0168471 A1* | 7/2009 | Tsugawa | .......... | H03K 17/08148 363/56.01 |

(Continued)

FOREIGN PATENT DOCUMENTS

JP 2004-031590 A 1/2004

*Primary Examiner* — Duy T Nguyen
(74) *Attorney, Agent, or Firm* — Rabin & Berdo, P.C.

(57) ABSTRACT

An electronic circuit having a first terminal and a second terminal. The electronic circuit includes a plurality of diodes connected in parallel, the plurality of diodes including a first diode and a second diode that respectively have applied thereto a first forward voltage and a second forward voltage, the second forward voltage being higher than the first forward voltage. A first path and a second path are formed from the first terminal, respectively via the first diode and the second diode, to the second terminal. An inductance of the first path is larger than an inductance of the second path.

11 Claims, 6 Drawing Sheets

(51) Int. Cl.
*H01L 23/538* (2006.01)
*H01L 29/16* (2006.01)

(58) Field of Classification Search
USPC .......................................................... 257/499
See application file for complete search history.

(56) References Cited

U.S. PATENT DOCUMENTS

| | | | |
|---|---|---|---|
| 2009/0206812 A1* | 8/2009 | Sasaya ................... | H03K 17/14 |
| | | | 323/282 |
| 2010/0039843 A1* | 2/2010 | Takizawa .............. | H02M 7/487 |
| | | | 257/E23.001 |
| 2013/0082284 A1 | 4/2013 | Okumura | |
| 2015/0229205 A1* | 8/2015 | Buthker ................. | H02M 7/06 |
| | | | 363/126 |
| 2017/0207213 A1* | 7/2017 | Sugimachi .......... | H01L 27/0629 |
| 2018/0034362 A1* | 2/2018 | Kubouchi ............. | H02M 1/36 |

* cited by examiner

CURRENT CONCENTRATION-SUPPRESSED ELECTRONIC CIRCUIT, AND SEMICONDUCTOR MODULE AND SEMICONDUCTOR APPARATUS CONTAINING THE SAME

CROSS REFERENCE TO RELATED APPLICATIONS

This application is based upon and claims the benefit of priority of the prior Japanese Patent Application No. 2019-232117, filed on Dec. 23, 2019, the entire contents of which are incorporated herein by reference.

TECHNICAL FIELD

The present invention relates to an electronic circuit, a semiconductor module, and a semiconductor apparatus.

BACKGROUND ART

A semiconductor apparatus includes a substrate provided with a semiconductor element such as an insulated gate bipolar transistor (IGBT), a power metal oxide semiconductor field effect transistor (power MOSFET), or a free wheeling diode (FWD) and is used for an inverter apparatus or the like. A specific configuration of this type of semiconductor apparatus is described in, for example, patent document 1.

The semiconductor apparatus described in patent document 1 includes a plurality of IGBTs and diodes connected in parallel. In this semiconductor apparatus, a flowing current is distributed between the individual IGBTs connected in parallel, and thus this semiconductor apparatus is suitable for use in an inverter apparatus that requires a heavy current.

The semiconductor apparatus described in patent document 1 includes a miniature metal plate on which the IGBTs and the diodes are mounted. Hence, the parasitic inductance of the metal plate is minimized, thereby minimizing a surge voltage generated when operating the inverter apparatus.

PRIOR ART DOCUMENT

Patent Document
Patent Document 1: Japanese Laid-open Patent Publication No. 2004-31590

SUMMARY OF THE INVENTION

Problems to be Solved by the Invention

Semiconductor elements such as IGBTs and diodes have individual differences associated with manufacturing processes. With respect to, for example, patent document 1, forward voltages (VF) on the diodes connected in parallel are different, and ON voltages ($V_{ON}$) on the IGBTs connected in parallel are also different. Due to the individual differences, a current is concentrated on certain ones of the diodes or IGBTs when operating the inverter apparatus. The certain semiconductor elements having a current concentrated thereon generate more heat than the other semiconductor elements and could possibly be broken due to abnormal heat generation.

The present invention was created in view of such facts, and an object of the invention is to provide an electronic circuit, semiconductor module, and semiconductor apparatus that can suppress a current from being concentrated on certain semiconductor elements among a plurality of semiconductor elements connected in parallel.

Means for Solving Problems

An electronic circuit in accordance with an aspect of the present invention includes a plurality of diodes connected in parallel and including a first diode and a second diode that has applied thereto a higher forward voltage than the first diode, wherein an inductance of a first path from a first terminal via the first diode to a second terminal is larger than an inductance of a second path from the first terminal via the second diode to the second terminal.

A semiconductor module in accordance with an aspect of the present invention is provided with an electronic circuit that includes a plurality of diodes connected in parallel and including a first diode and a second diode that has applied thereto a higher forward voltage than the first diode. The semiconductor module is such that an inductance of a wiring member forming a first path from a first terminal via the first diode to a second terminal is larger than an inductance of a wiring member forming a second path from the first terminal via the second diode to the second terminal.

A semiconductor apparatus in accordance with an aspect of the present invention includes a plurality of said semiconductor modules, the plurality of semiconductor modules being connected in parallel between a pair of terminals. Paths each extending from one to another of the pair of terminals via each of the plurality of semiconductor modules are such that paths extending via semiconductor modules that have a lower forward voltage applied thereto have a larger inductance.

An electronic circuit in accordance with another aspect of the present invention includes a plurality of switching elements connected in parallel and including a first switching element and a second switching element that has applied thereto a higher ON voltage than the first switching element, wherein an inductance of a first path from a first terminal via the first switching element to a second terminal is larger than an inductance of a second path from the first terminal via the second switching element to the second terminal.

Effect of the Invention

In an aspect of the present invention, an electronic circuit, a semiconductor module, and a semiconductor apparatus can suppress a current from being concentrated on certain semiconductor elements among a plurality of semiconductor elements connected in parallel.

DESCRIPTION OF EMBODIMENTS

Figure 1:
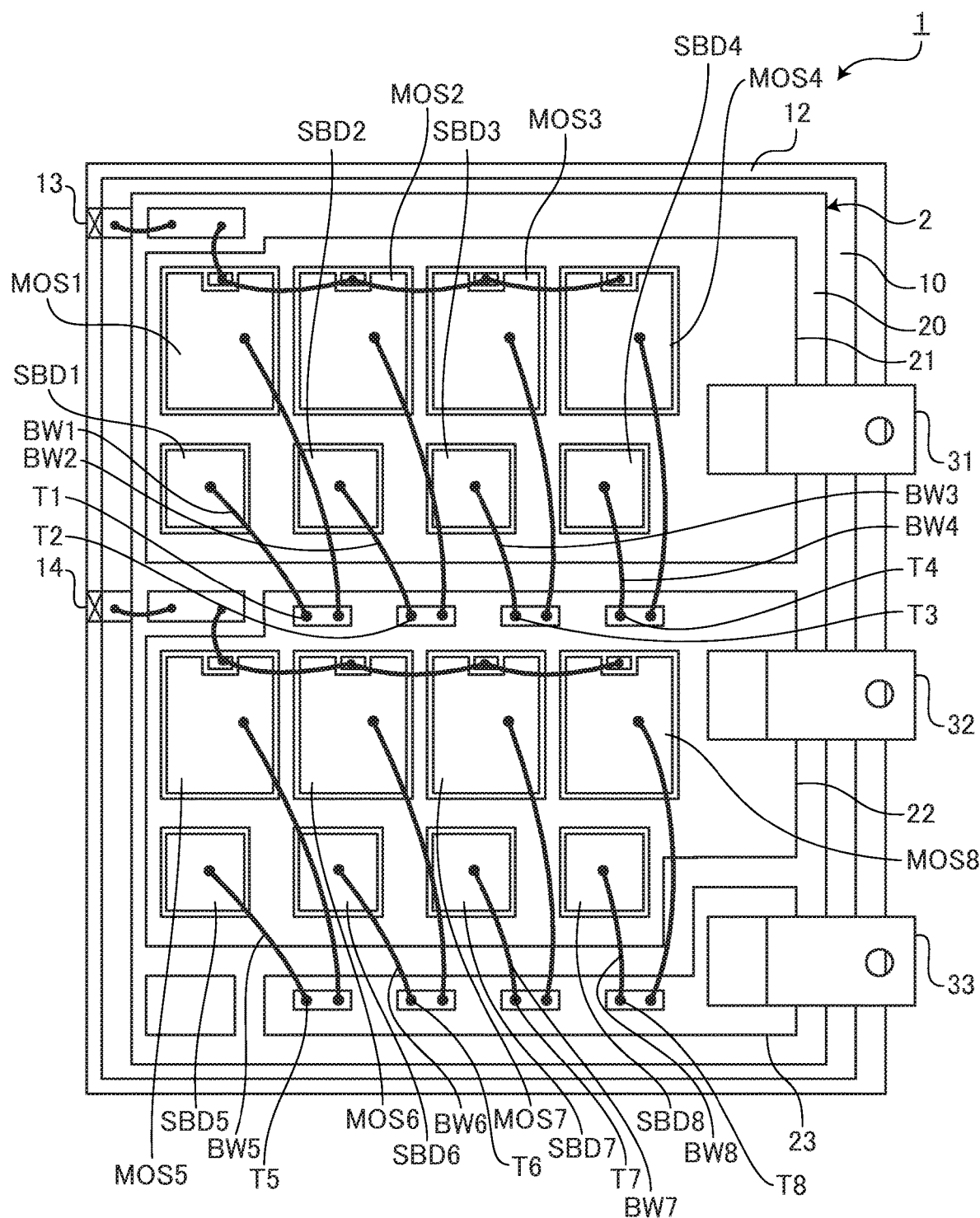
FIG. 1 is a schematic plan view illustrating a semiconductor module in accordance with an embodiment of the present invention.
Figure 2:
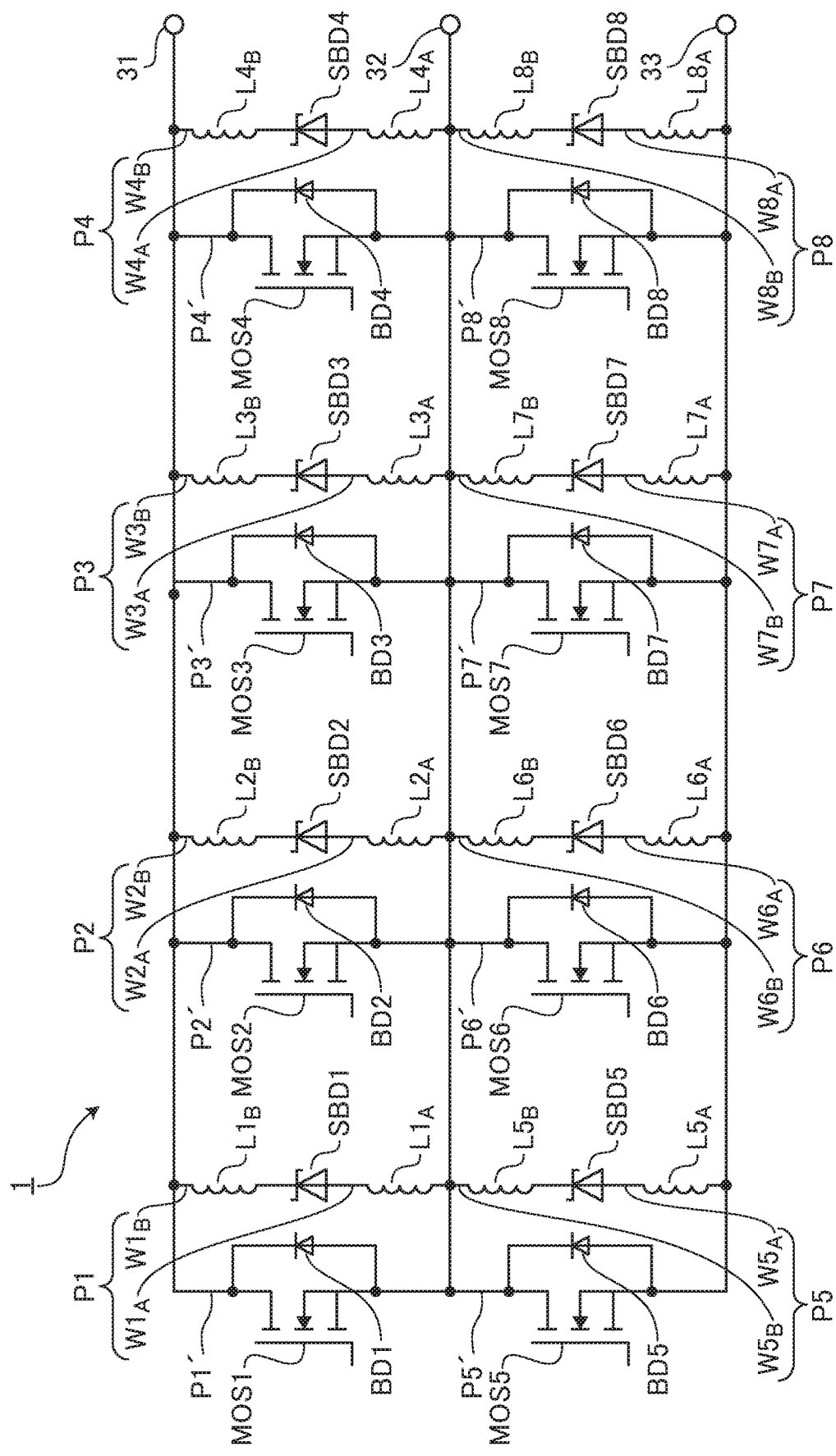
FIG. 2 is an equivalent circuit schematic illustrating a semiconductor module in accordance with an embodiment of the invention.

The following describes a semiconductor module to which the present invention can be applied. FIGS. 1 and 2 are respectively a schematic plan view and an equivalent circuit schematic illustrating a semiconductor module 1 in accordance with an embodiment of the invention. The semiconductor module 1 in accordance with the embodiment of the invention is nothing but an example, and the invention is not limited to this and can have changes made thereto, as appropriate.

The semiconductor module 1, which is applied to, for example, a power module, includes a baseboard 10, a layered substrate 2 disposed over the baseboard 10, and a case member 12 accommodating the layered substrate 2, as depicted in FIG. 1.

The baseboard 10 is a metal plate shaped like a quadrangle when seen in a plan view and formed from, for example, copper, aluminum, or an alloy thereof. The baseboard 10 serves as a heat dissipation plate that dissipates heat from the layered substrate 2 or electronic components mounted on the layered substrate 2 to the outside.

The case member 12 is a resin frame body shaped like a rectangle having sides along the outer shape of the baseboard 10 and bonded to, for example, the baseboard 10. A space surrounded by the baseboard 10 and the case member 12 is filled with a sealing resin (not illustrated). The layered substrate 2 and electronic components mounted thereon are sealed within the space by the sealing resin.

For example, the layered substrate 2 may be formed from a direct bonded aluminum (DBA) substrate, a direct bonded copper (DBC) substrate, or an active metal brazing (AMB) substrate. The layered substrate 2 includes an insulation layer 20 formed from an insulator such as ceramic, e.g., a ceramic material of alumina ($Al_2O_3$), aluminum nitride (AlN), or silicon nitride ($Si_3N_4$). A first circuit board 21, a second circuit board 22, and a third circuit board 23 are formed over an upper surface of the insulation layer 20. The circuit boards are metal layers of copper foil or the like, formed like islands over the insulation layer 20, and electrically insulated from each other.

A P terminal (positive potential point) 31, a U terminal (intermediate potential point) 32, and an N terminal (negative potential point) 33 are respectively disposed on (connected to) the first circuit board 21, the second circuit board 22, and the third circuit board 23 with a bonding material such as solder between the terminals and the circuit boards. The P terminal 31, the U terminal 32, and the N terminal are external connection terminals via which a principal current is input/output to/from the semiconductor module 1.

A plurality of electronic components are disposed over the first circuit board 21 and the second circuit board 22 with a bonding material such as solder therebetween. In particular, switching elements MOS1-MOS4 and diodes SBD1-SBD4 are disposed over the first circuit board 21 with a bonding material therebetween. Switching elements MOS5-MOS8 and diodes SBD5-SBD8 are disposed over the second circuit board 22 with a bonding material therebetween.

For example, the switching elements MOS1-MOS8 may be semiconductor switching elements produced using silicon (Si), silicon carbide (SiC), or gallium carbide (GaN), in particular power MOSFETs. When the switching elements MOS1-MOS8 are power MOSFETs, these switching elements each have, on a back side thereof, a drain terminal to serve as a main electrode and, on a front side thereof, a gate electrode and a source electrode to serve as a main electrode. The switching elements MOS1-MOS8 may include body diodes parasitic in the power MOSFETs. The body diodes are connected in antiparallel to the power MOSFETs and each have a cathode electrode provided on a back side thereof and an anode electrode provided on a front side thereof. The switching elements MOS1-MOS8 may be switching elements having another structure, such as IGBTs. When the switching elements MOS1-MOS8 are IGBTs, these switching elements each have, on a back side thereof, a collector terminal to serve as a main electrode and, on a front side thereof, a gate electrode and an emitter electrode to serve as a main electrode. In addition, the switching elements MOS1-MOS8 may each be a reverse-conducting IGBT (RC-IGBT) provided by forming an IGBT and a diode into one chip. The diodes in this case are connected in antiparallel to the IGBTs and each have a cathode electrode provided on a back side thereof and an anode electrode provided on a front side thereof.

The switching elements MOS1-MOS4 are connected in parallel. The drain electrodes of the switching elements MOS1-MOS4 are disposed over the first circuit board 21 with a bonding material such as solder therebetween and electrically connected to the P terminal 31. The source electrodes are electrically connected to the second circuit board 22 by bonding wires and electrically connected to the U terminal 32.

The gate electrodes of the switching elements MOS1-MOS4 are connected by one bonding wire. The one bonding wire connecting the gate electrodes is electrically connected to a terminal member 13 buried in the case member 12. While a voltage from the terminal member 13 that exceeds a predetermined threshold is being applied to the gate electrodes, the switching elements MOS1-MOS4 are turned on, thereby causing a current to flow from the drain electrodes to the source electrodes. While a voltage from the terminal member 13 that exceeds the predetermined threshold is not applied to the gate electrodes, the switching elements MOS1-MOS4 are turned off, thereby interrupting a current from the drain electrodes to the source electrodes.

The switching elements MOS5-MOS8 are also connected in parallel. The drain electrodes of the switching elements MOS5-MOS8 are disposed over the second circuit board 22 with a bonding material such as solder therebetween and electrically connected to the U terminal 32. The source electrodes are electrically connected to the third circuit board 23 by bonding wires and electrically connected to the N terminal 33.

The gate electrodes of the switching elements MOS5-MOS8 are also connected by one bonding wire. The one bonding wire connecting the gate electrodes is electrically connected to a terminal member 14 buried in the case member 12 by a control circuit board. While a voltage from the terminal member 14 that exceeds a predetermined threshold is being applied to the gate electrodes, the switching elements MOS5-MOS8 are turned on, thereby causing a current to flow from the drain electrodes to the source electrodes. While a voltage from the terminal member 14 that exceeds the predetermined threshold is not applied to the gate electrodes, the switching elements MOS5-MOS8 are turned off, thereby interrupting a current from the drain electrodes to the source electrodes. The wirings for the source electrodes and the third circuit board 23 and the wirings for the gate electrodes and the control circuit board are not limited to bonding wires and may be replaced with other conductive wiring members such as ribbon wires or lead frames.

The diodes SBD1-SBD8 are diodes produced using SiC, in particular, Schottky barrier diodes. The diodes SBD1-SBD8 may be produced using Si or SiC. Some of or all of the diodes SBD1-SBD8 may be replaced with diodes having another structure such as junction barrier Schottky (JBS) diodes, merged PN Schottky (MPS) diodes, or PN diodes. In addition, the diodes SBD1-SBD8 may be diodes installed in RC-IGBTs. Thus, the diodes SBD1-SBD8 are not limited to Schottky barrier diodes and may each have a different configuration. However, parallelly connected diodes preferably have the same structure. The diodes SBD1-SBD8 each include a cathode electrode provided on the back side thereof as a main electrode and an anode electrode provided on the front side thereof as a main electrode.

The diodes SBD1-SBD4 are a plurality of diodes connected in parallel and including a first diode and a second diode that has applied thereto a higher forward voltage than the first diode. The diodes SBD5-SBD8 are also a plurality of diodes connected in parallel and including a first diode and a second diode that has applied thereto a higher forward voltage than the first diode. In this regard, a forward voltage is a voltage generated when a forward current flows through a diode. For example, a forward voltage may be a voltage generated between an anode electrode and a cathode electrode when a rated current flows from the anode electrode to the cathode electrode.

The diodes SBD1-SBD4 are connected in parallel to the switching elements MOS1-MOS4, respectively. More specifically, the diodes SBD1-SBD4 are free wheeling diodes (FWDs) and connected in antiparallel to the switching elements MOS1-MOS4, respectively. The anode electrodes of the diodes SBD1-SBD4 are electrically connected to the U terminal 32, and the cathode electrodes thereof are electrically connected to the P terminal 31.

As depicted in FIG. 2, symbols P1-P4 respectively denote paths from the U terminal 32 via the diodes SBD1-SBD4 to the P terminal 31. The paths P1-P4 are respectively formed from wiring members $W1_A$-$W4_A$ electrically connecting the U terminal 32 to the anode electrodes of the diodes SBD1-SBD4 and wiring members $W1_B$-$W4_B$ electrically connecting the cathode electrodes of the diodes SBD1-SBD4 to the P terminal 31.

Symbols $L1_A$-$L4_A$ respectively denote inductances parasitic in portions of the paths P1-P4 between the U terminal 32 and the anode electrodes of the diodes SBD1-SBD4 (i.e., parasitic in the wiring members $W1_A$-$W4_A$). Symbols $L1_B$-$L4_B$ respectively denote inductances parasitic in portions of the paths P1-P4 between the P terminal 31 and the cathode electrodes of the diodes SBD1-SBD4 (i.e., parasitic in the wiring members $W1_B$-$W4_B$).

As indicated in FIG. 1, the wiring members $W1_A$-$W4_A$ depicted in FIG. 2 respectively include wiring patterns on the second circuit board 22 that connect the U terminal 32 to electrodes T1-T4 on the second circuit board 22 and bonding wires BW1-BW4 that connect the electrodes T1-T4 to the anode electrodes of the diodes SBD1-SBD4. As indicated in FIG. 1, the wiring members $W1_B$-$W4_B$ depicted in FIG. 2 respectively include wiring patterns on the first circuit board 21 that connect the cathode electrodes of the diodes SBD1-SBD4 to the P terminal 31. Illustration of these wiring patterns is omitted to avoid complicating the figures. Note that the bonding wires BW1-BW4 may be replaced with other conductive wiring members such as ribbon wires or lead frames.

The diodes SBD5-SBD8 are connected in parallel to the switching elements MOS5-MOS8, respectively. More specifically, the diodes SBD5-SBD8 are FWDs and connected in antiparallel to the switching elements MOS5-MOS8, respectively. The anode electrodes of the diodes SBD5-SBD8 are connected to the N terminal 33, and the cathode electrodes thereof are connected to the U terminal 32.

As depicted in FIG. 2, symbols P5-P8 respectively denote paths from the N terminal 33 via the diodes SBD5-SBD8 to the U terminal 32. The paths P5-P8 are respectively formed from wiring members $W5_A$-$W8_A$ connecting the N terminal 33 to the anode electrodes of the diodes SBD5-SBD8 and wiring members $W5_B$-$W8_B$ connecting the cathode electrodes of the diodes SBD5-SBD8 to the U terminal 32.

Symbols $L5_A$-$L8_A$ respectively denote inductances parasitic in portions of the paths P5-P8 between the N terminal 33 and the anode electrodes of the diodes SBD5-SBD8 (i.e., parasitic in the wiring members $W5_A$-$W8_A$). Symbols $L5_B$-$L8_B$ respectively denote inductances parasitic in portions of the paths P1-P4 between the cathode electrodes of the diodes SBD5-SBD8 and the U terminal 32 (i.e., parasitic in the wiring members $W5_B$-$W8_B$).

As indicated in FIG. 1, the wiring members $W5_A$-$W8_A$ depicted in FIG. 2 respectively include wiring patterns on the third circuit board 23 that connect the N terminal 33 to electrodes T5-T8 on the third circuit board 23 and bonding wires BW5-BW8 that connect the electrodes T5-T8 to the anode electrodes of the diodes SBD5-SBD8. As indicated in FIG. 1, the wiring members $W5_B$-$W8_B$ depicted in FIG. 2 respectively include wiring patterns on the second circuit board 22 that connect the cathode electrodes of the diodes SBD5-SBD8 to the U terminal 32. Illustration of these wiring patterns is also omitted to avoid complicating the figures. Note that the bonding wires BW5-BW8 may be replaced with other conductive wiring members such as ribbon wires or lead frames.

Symbols BD1-BD8 in FIG. 2 respectively denote body diodes parasitic in the switching elements MOS1-MOS8. As depicted in FIG. 2, the diodes BD1-BD8 are respectively connected in antiparallel to channels of the switching elements MOS1-MOS8.

The semiconductor module 1 which is configured as described above involves a period in which a current flows in reverse from the negative-potential side to the positive-potential side in accordance with the switching elements MOS1-MOS8 being turned on or off. The diodes SBD1-SBD8, i.e., Schottky barrier diodes connected in antiparallel to the switching elements MOS1-MOS8, have applied thereto a lower forward voltage than the diodes BD1-BD8, i.e., body diodes parasitic in the switching elements MOS1-MOS8. Thus, a current flowing from the U terminal 32 to the P terminal 31 flows through the diodes SBD1-SBD4, as long as an applied voltage does not exceed the forward voltages specific to the diodes BD1-BD4. A current flowing from the N terminal 33 to the U terminal 32 flows through the diodes SBD5-SBD8, as long as an applied voltage does not exceed the forward voltages specific to the diodes BD5-BD8.

Assume, for example, that the switching elements MOS1-MOS8 are power MOSFETs produced using SiC. In this case, the forward voltage on the diodes BD1-BD8 parasitic in the switching elements MOS1-MOS8 will increases with a time of current carrying and thus could cause degradation due to the current carrying, thereby breaking the switching elements MOS1-MOS8. In embodiments, however, the diodes SBD1-SBD8, which have a low forward voltage applied thereto, are connected in parallel to the diodes BD1-BD8, thereby making a current unlikely to flow through the diodes BD1-BD8. Hence, degradation of the diodes BD1-BD8 caused by current carrying is suppressed so that the switching elements MOS1-MOS8 can have a higher long-term reliability.

The diodes SBD1-SBD8 have the same structure but have individual differences associated with manufacturing processes. Accordingly, forward voltages on the diodes SBD1-SBD8 have variations.

When a plurality of diodes are connected in parallel, a current will typically be concentrated more on diodes for which a lower forward voltage has been set. If a current flowing from the U terminal 32 to the P terminal 31 is concentrated on the diode for which the lowest forward voltage has been set among the diodes SBD1-SBD4, this diode will generate more heat than the other diodes due to the current concentration and could possibly be broken due to abnormal heat generation. Similarly, if a current flowing from the N terminal 33 to the U terminal 32 is concentrated on the diode for which the lowest forward voltage has been set among the diodes SBD5-SBD8, this diode will generate more heat than the other diodes due to the current concentration and could possibly be broken due to abnormal heat generation.

The inventor conceived of the present invention by focusing on variations in forward voltage between a plurality of diodes. In embodiments, the semiconductor module 1 is configured to suppress a current from being concentrated on certain diodes therein so as to prevent these diodes from being broken due to abnormal heat generation as described above.

In embodiments, more specifically, forward voltages are measured in advance for four Schottky barrier diodes so as to attain the configuration described above. The Schottky barrier diode for which the lowest forward voltage has been calculated is disposed in the path P1, and the other Schottky barrier diodes are disposed in the paths P2-P4 in ascending order of forward voltage. Thus, the diodes SBD1-SBD4 are such that diodes denoted by a symbol with a smaller value have a lower forward voltage applied thereto.

Meanwhile, the semiconductor module 1 in accordance with embodiments is such that paths in which Schottky barrier diodes that have a lower forward voltage applied thereto are disposed among the paths P1-P4 connected in parallel have a larger parasitic inductance. Accordingly, the parasitic inductance of the path P1 (i.e., wiring members $W1_A$ and $W1_B$) (the sum of inductances $L1_A$ and $L1_B$, which is hereinafter referred to as "inductance $(L1_A+L1_B)$"; the parasitic inductances of the other paths will also be represented in a similar manner) is the largest among the parasitic inductances of the paths P1-P4, and the parasitic inductances of the paths P2-P4 (i.e., wiring members $W2_A$ and $W2_B$, wiring members $W3_A$ and $W3_B$, and wiring members $W4_A$ and $W4_B$) go from larger to smaller in this order. Thus, the paths P1-P4 are such that paths denoted by a symbol with a lower value have a larger parasitic inductance.

As described above, the semiconductor module 1 includes an electronic circuit wherein the inductance of a first path (e.g., path P1) from a first terminal (e.g., U terminal 32) via a first diode (e.g., diode SBD1) to a second terminal (e.g., P terminal 31) is larger than the inductance of a second path (e.g., path P2) from the first terminal via a second diode (e.g., diode SBD2) to the second terminal.

The semiconductor module 1 also satisfies at least one of the following conditions (1)-(4) so as to arrange the paths P1-P4 such that paths denoted by a symbol with a lower value have a larger parasitic inductance.

(1) The total length of a bonding wire forming one path (hereinafter, "first conductive wire") is greater than that of a bonding wire forming another path in which a Schottky barrier diode is disposed and to which a forward voltage higher than that applied to the one path is applied (hereinafter, "second conductive wire").

(2) The first conductive wire has a smaller cross-sectional area than the second conductive wire.

(3) The total length of a wiring pattern forming one path (hereinafter, "first wiring pattern") is greater than that of a wiring pattern forming another path in which a Schottky barrier diode is disposed and to which a forward voltage higher than that applied to the one path is applied (hereinafter, "second wiring pattern").

(4) The first wiring pattern has a smaller cross-sectional area than the second wiring pattern.

The conditions (1) and (2) indicate conditions for allowing the first conductive wire to have a larger parasitic inductance than the second conductive wire. The conditions (3) and (4) indicate conditions for allowing the first wiring pattern to have a larger parasitic inductance than the second wiring pattern.

Figure 3A:
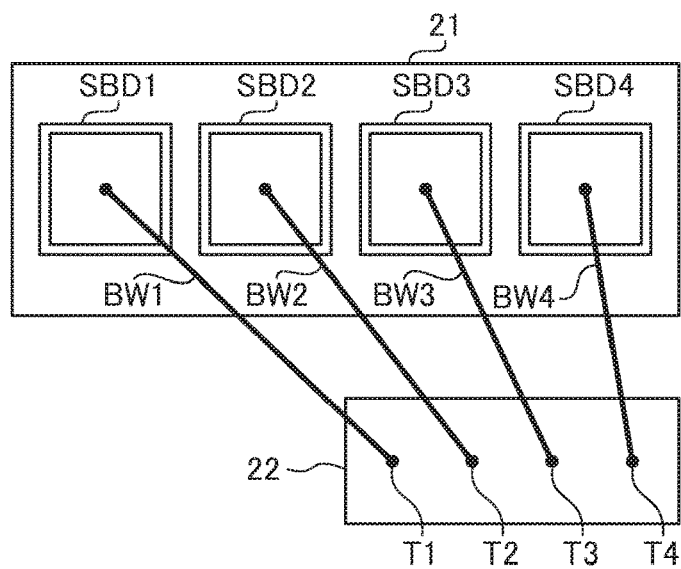
FIG. 3A conceptually illustrates relationships in length between bonding wires connecting a plurality of diodes connected in parallel to electrodes on a circuit board in an embodiment of the invention.
Figure 3B:
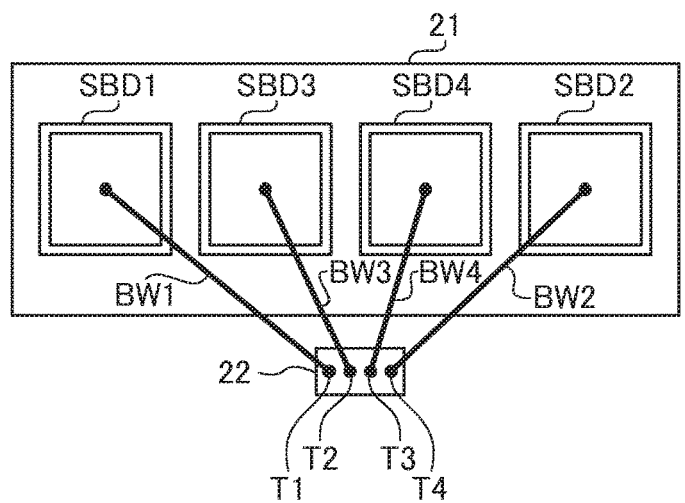
FIG. 3B conceptually illustrates relationships in length between bonding wires connecting a plurality of diodes connected in parallel to electrodes on a circuit board in an embodiment of the invention.
Figure 4:
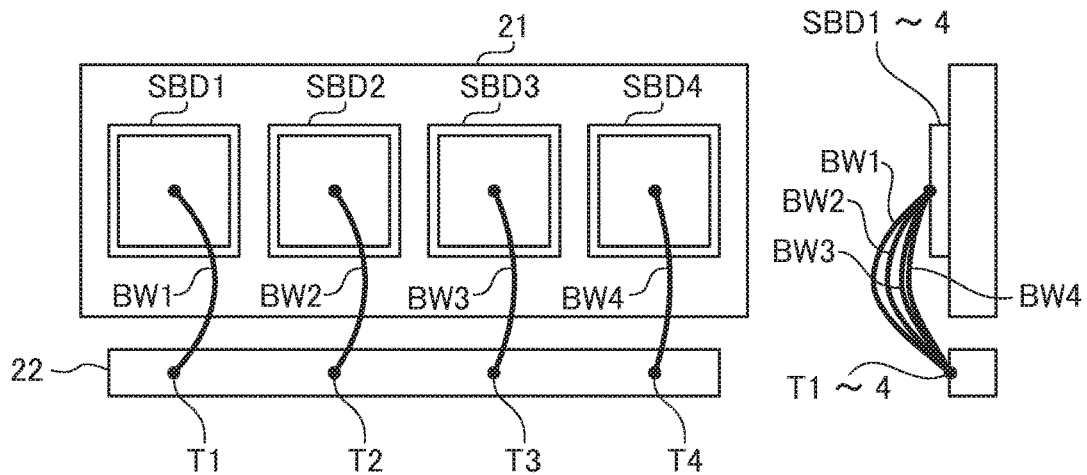
FIG. 4 conceptually illustrates relationships in length between bonding wires connecting a plurality of diodes connected in parallel to electrodes on a circuit board in an embodiment of the invention.

FIGS. 3A, 3B, and 4 conceptually illustrate the condition (1). As depicted in FIGS. 3A, 3B, and 4, the bonding wires BW1-BW4 are arranged such that bonding wires denoted by a symbol with a lower value have a greater total length.

In the example depicted in FIG. 3A, the diodes SBD1-SBD4 are arranged in line in this order on the first circuit board 21. The second circuit board 22 is formed on a side close to the diode SBD4 to which a high forward voltage is applied. The diodes SBD1-SBD4 are electrically connected to the electrodes T1-T4 of the second circuit board 22 by the bonding wires BW1-BW4, respectively. Thus, the diodes SBD1-SBD4 are arranged such that diodes denoted by a symbol with a smaller value (diodes to which a lower forward voltage is applied) are positioned farther from a corresponding electrode among the electrodes T1-T4. Thus, the bonding wires BW1-BW4 are such that bonding wires denoted by a symbol with a lower value have a greater total length. For example, the total length of the bonding wire BW1 forming the path P1 in which the diode SBD1 is disposed may be greater than that of the bonding wire BW2 forming the path P2 in which the diode SBD2 that has applied thereto a higher forward voltage than the diode SBD1 is disposed. Thus, the bonding wires BW1-BW4 are such that bonding wires denoted by a symbol with a lower value have a larger parasitic inductance. Accordingly, the paths P1-P4, which respectively include the bonding wires BW1-BW4, are such that paths denoted by a symbol with a lower value have a larger parasitic inductance.

FIG. 3B illustrates a variation of the example depicted in FIG. 3A. In the example depicted in FIG. 3B, the diodes SBD1, SBD3, SBD4, and SBD2 are arranged in line in this order on the first circuit board 21. The second circuit board 22 is formed at a position slightly shifted from a center of the first circuit board 21 toward the diode SBD4. In the example depicted in FIG. 3B, the diodes SBD1-SBD4 are arranged such that diodes denoted by a symbol with a smaller value (diodes to which a lower forward voltage is applied) are positioned farther from a corresponding electrode among the electrodes T1-T4, as in the example illustrated in FIG. 3A. Thus, the bonding wires BW1-BW4 are such that bonding wires denoted by a symbol with a lower value have a greater total length and a larger parasitic inductance. Accordingly, the paths P1-P4 which respectively include the bonding wires BW1-BW4 are such that paths denoted by a symbol with a lower value have a larger parasitic inductance.

In the example depicted in FIG. 4, the diodes SBD1-SBD4 are arranged in line in this order on the first circuit board 21. The second circuit board 22 is formed at a position next to the first circuit board 21. As depicted in the plan view in FIG. 4, the distances between the diodes SBD1-SBD4 and the electrodes T1-T4 are equal when seen in a plan view. Meanwhile, as depicted in the plan view and the side view in FIG. 4, the bonding wires BW1-BW4 are arranged to be slightly curved in a manner such that bonding wires denoted by a symbol with a lower value (diodes to which a lower forward voltage is applied) are curved to greater degree (curved with a greater curvature) (smaller in radius of curvature). In other words, the bonding wires BW1-BW4 are arranged such that bonding wires denoted by a symbol with a lower value are curved more greatly, become greater in total length, and thus have a larger parasitic inductance. Accordingly, the paths P1-P4 which respectively include the bonding wires BW1-BW4 are such that paths denoted by a symbol with a lower value have a larger parasitic inductance.

Figure 5:
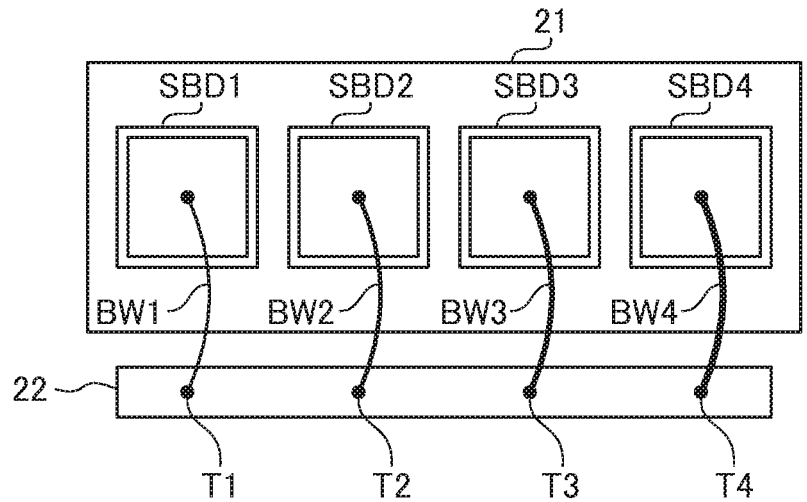
FIG. 5 conceptually illustrates magnitude relationships between cross-sectional areas of bonding wires connecting a plurality of diodes connected in parallel to electrodes on a circuit board in an embodiment of the invention.
Figure 6:
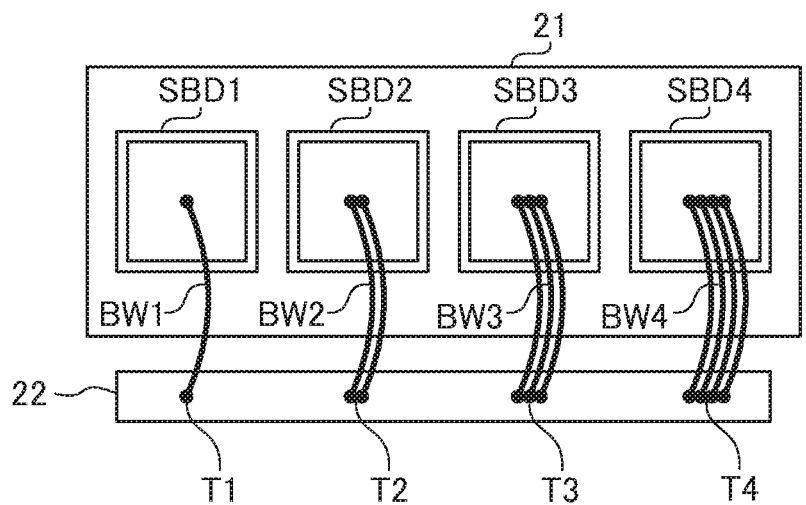
FIG. 6 conceptually illustrates magnitude relationships between cross-sectional areas of bonding wires connecting a plurality of diodes connected in parallel to electrodes on a circuit board in an embodiment of the invention.

FIGS. 5 and 6 conceptually illustrate the condition (2). In the examples depicted in FIGS. 5 and 6, the diodes SBD1-SBD4 are arranged in line in this order on the first circuit board 21, as in the example illustrated in FIG. 4. The second circuit board 22 is formed at a position next to the first circuit board 21. The total lengths of the bonding wires BW1-BW4 are equal, unlike in the examples depicted in FIGS. 3A, 3B, and 4.

As depicted in FIGS. 5 and 6, the bonding wires BW1-BW4 are arranged such that bonding wires denoted by a symbol with a lower value have a smaller cross-sectional area. In the example depicted in FIG. 5, in particular, the bonding wires BW1-BW4 are each formed from one wire and arranged such that bonding wires denoted by a symbol with a lower value (diodes to which a lower forward voltage is applied) have a smaller wire diameter and a smaller cross-sectional area. In the example depicted in FIG. 6, the bonding wires BW1-BW4 are each formed from a plurality of wires having an equal wire diameter and arranged such that bonding wires denoted by a symbol with a lower values (diodes to which a lower forward voltage is applied) have less wires and a smaller total cross-sectional area. Thus, in both of the examples in FIGS. 5 and 6, the bonding wires BW1-BW4 are arranged such that bonding wires denoted by a symbol with a lower value have a smaller cross-sectional area and a larger parasitic inductance. Accordingly, the paths P1-P4, which respectively include the bonding wires BW1-BW4, are such that paths denoted by a symbol with a lower value have a larger parasitic inductance.

Figure 7:
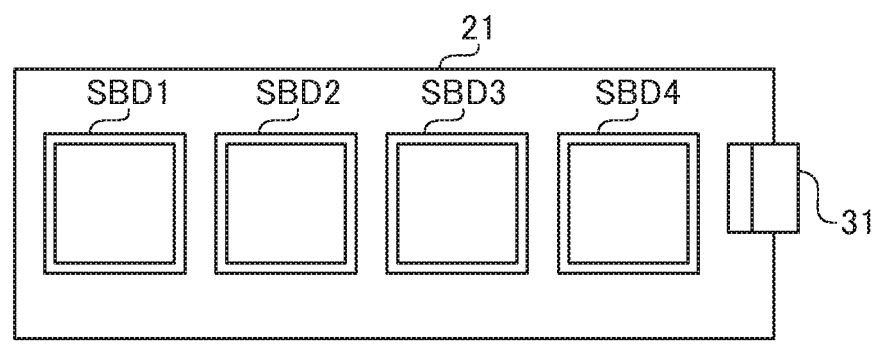
FIG. 7 conceptually illustrates relationships in length between wiring patterns connected to a plurality of diodes in an embodiment of the invention.

FIG. 7 conceptually illustrates the condition (3). In the example depicted in FIG. 7, the diodes SBD1-SBD4 are arranged in line in this order on the first circuit board 21, as in the example illustrated in FIG. 4. In the example of FIG. 7, the distances between the diodes SBD1-SBD4 and the P terminal 31 are different. In particular, the diodes SBD1-SBD4 are arranged such that diodes denoted by a symbol with a lower value (diodes to which a lower forward voltage is applied) are positioned farther from the P terminal 31 and have a longer wiring pattern formed on the first circuit board 21 and connected to the P terminal 31. Thus, the wiring patterns forming the paths P1-P4 that are provided on the first circuit board 21 are such that wiring patterns forming paths in which diodes denoted by a symbol with a lower value among the diodes SBD1-SBD4 are disposed have a greater total length and a larger parasitic inductance. Thus, the paths P1-P4 are such that paths denoted by a symbol with a lower value have a larger parasitic inductance.

Figure 8:
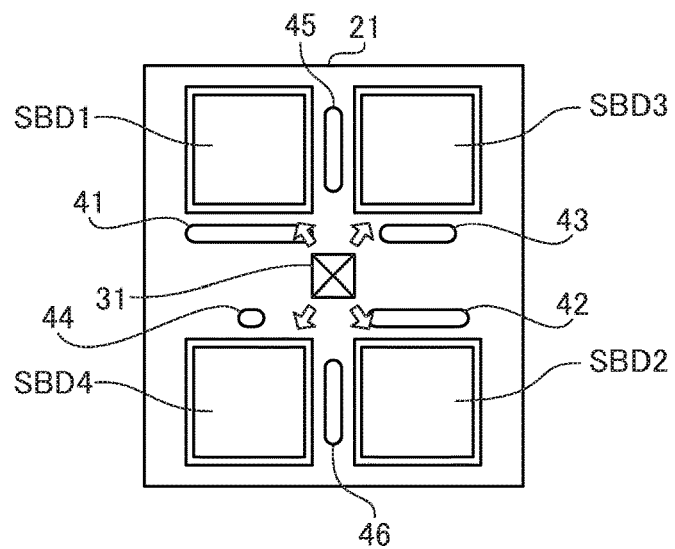
FIG. 8 conceptually illustrates magnitude relationships between cross-sectional areas of wiring patterns connected to a plurality of diodes in an embodiment of the invention.

FIG. 8 conceptually illustrates the condition (4). Note that arrows are provided for descriptive purposes in FIG. 8 and FIGS. 9 and 10, which will be described hereinafter, and these arrows do not indicate components. In the example depicted in FIG. 8, the P terminal 31 is disposed on a center of the first circuit board 21 with a bonding material such as solder therebetween. The diodes SBD1-SBD4 are disposed at four positions centered around the P terminal 31 and positioned at an equal distance from the P terminal 31. A plurality of slits 41-46 having different widths are formed in the first circuit board 21. The slits 41 and 44 are respectively formed between the diodes SBD1-SBD4 and the P terminal 31 and are arranged such that slits denoted by a symbol with a lower value have a greater width. The slit 45 is formed between the diodes SBD1 and SBD3. The slit 46 is formed between the diodes SBD2 and SBD4. The widths of the slits 45 and 46 are less than that of the slit 42 and greater than that of the slit 43. As a result of forming the slits 41-46 in the first circuit board 21, the wiring patterns forming paths in which diodes denoted by a symbol with a lower value among the diodes SBD1-SBD4 are disposed have a smaller average cross-sectional area between the diode, i.e., a corresponding diode among the diodes SBD1-SBD4, and the P terminal 31 and have a larger parasitic inductance. Thus, the paths P1-P4 are such that paths denoted by a symbol with a lower value have a larger parasitic inductance.

Figure 9:
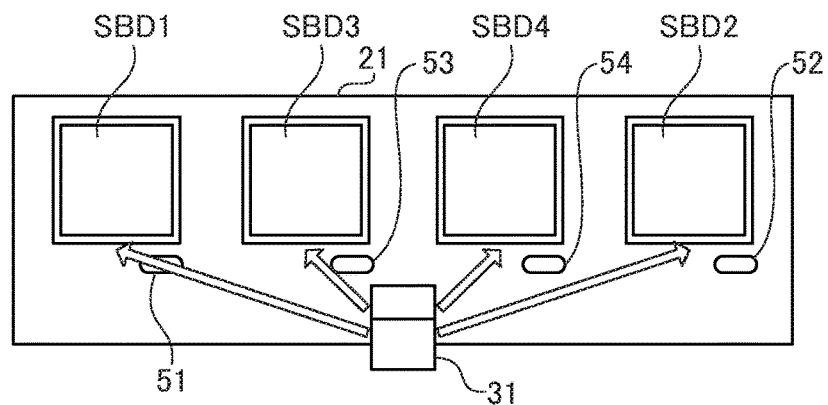
FIG. 9 conceptually illustrates relationships in length between wiring patterns connected to a plurality of diodes in an embodiment of the invention and magnitude relationships between cross-sectional areas of these wiring patterns.

FIG. 9 conceptually illustrates a combination of the conditions (3) and (4). In the example depicted in FIG. 9, the diodes SBD1, SBD3, SBD4, and SBD2 are arranged in line in this order on the first circuit board 21. The P terminal 31 is disposed in the vicinity of a center of the first circuit board 21 with a bonding material such as solder therebetween. The diodes SBD1 and SBD2 are at an equal distance from the P terminal 31. The diodes SBD3 and SBD4 are at an equal distance from the P terminal 31 and positioned nearer to the P terminal 31 than the diodes SBD1 and SBD2 are. Meanwhile, slits 51-54 that are equal in width are respectively formed at positions close to the diodes SBD1-SBD4. As a result of forming the slits 51-54 in the first circuit board 21, the wiring patterns on the first circuit board 21 are such that the wiring patterns forming the paths in which the diodes SBD1 and SBD3 are disposed have smaller average cross-sectional areas and larger parasitic inductances than the wiring patterns forming the paths in which the diodes SBD2 and SBD4 are disposed.

In the example of FIG. 9, accordingly, although the diodes SBD1 and SBD2 are positioned at an equal distance from the P terminal 31, the wiring pattern forming the path in which the diode SBD1 is disposed has a smaller average cross-sectional area. Thus, the path P1 in which the diode SBD1 is disposed has a larger parasitic inductance than the path P2 in which the diode SBD2 is disposed.

The distances between the diodes SBD3 and SBD4 and the P terminal 31 are shorter than the distances between the diodes SBD1 and SBD2 and the P terminal 31. Although the diodes SBD3 and SBD4 are positioned at an equal distance from the P terminal 31, the wiring pattern forming the path in which the diode SBD3 is disposed has a smaller average cross-sectional area. Thus, the parasitic inductance of the path P3 in which the diode SBD3 is disposed is smaller than those of the paths P1 and P2 but is larger than that of the path P4 in which the diode SBD4 is disposed.

In the example depicted in FIG. 9, as described above, the paths P1-P4 are such that paths denoted by a symbol with a lower value have a larger parasitic inductance.

The paths depicted in FIG. 1 that extend from the U terminal 32 via the diodes SBD1-SBD4 to the P terminal 31 correspond to the combination of the conditions (1) and (3). Similarly, the paths depicted in FIG. 1 that extend from the N terminal 33 via the diodes SBD5-SBD8 to the U terminal 32 correspond to the combination of the conditions (1) and (3).

In particular, as depicted in FIG. 1, the bonding wires BW1-BW4 are such that bonding wires denoted by a symbol with a lower value have a greater total length and a larger parasitic inductance. The diodes SBD1-SBD4 are arranged such that diodes denoted by a symbol with a lower value (diodes to which a lower forward voltage is applied) are positioned farther from the P terminal 31 and have a longer wiring pattern formed on the first circuit board 21 and connected to the P terminal 31. Thus, the wiring patterns forming the paths P1-P4 that are provided on the first circuit board 21 are such that wiring patterns forming paths in which diodes denoted by a symbol with a lower value among the diodes SBD1-SBD4 are disposed have a greater total length and a larger parasitic inductance. As a result, the paths P1-P4 are such that paths denoted by a symbol with a lower value have a larger parasitic inductance.

Similarly, the bonding wires BW5-BW8 are arranged such that bonding wires denoted by a symbol with a lower value have a greater total length and a larger parasitic inductance. The diodes SBD5-SBD8 are arranged such that diodes denoted by a symbol with a lower value (diodes to which a lower forward voltage is applied) are positioned farther from the P terminal 31 and have a longer wiring pattern formed on the second circuit board 22 and connected to the U terminal 32. Thus, the wiring patterns forming the paths P5-P8 that are provided on the second circuit board 22 are such that wiring patterns forming paths in which diodes denoted by a symbol with a lower value among the diodes SBD5-SBD8 are disposed have a greater total length and a larger parasitic inductance. As a result, the paths P5-P8 are such that paths denoted by a symbol with a lower value have a larger parasitic inductance.

The semiconductor module 1 does not need to be configured to satisfy all of the conditions (1)-(4). When, for example, the total length of the bonding wire BW2 is greater than that of the bonding wire BW1, the wiring members $W1_A$, $W2_A$, $W1_B$, and $W2_B$ may be formed to satisfy at least one of the conditions (2)-(4) such that the parasitic inductance of the entirety of the path P1 is larger than the parasitic inductance of the entirety of the path P2.

The conditions (1)-(4) have been presented as exemplary conditions. The semiconductor module 1 may be configured not to satisfy all of the conditions (1)-(4), as long as paths denoted by a symbol with a lower value have a larger parasitic inductance.

A current from the U terminal 32 that is to arrive at the P terminal 31 starts to flow through the path in which the Schottky barrier diode that has the lowest forward voltage applied thereto among the paths P1-P4 (i.e., path P1) is disposed. With a change (increase) in the current flowing through the path P1, a counter-electromotive force proportional to the parasitic inductance of the wiring members $W1_A$ and $W1_B$ ($L1_A+L1_B$) is generated in the path P1. The counter-electromotive force disrupts the current flow through the path P1. In other words, the current easily flows through the paths P2-P4.

When the current through the path P2 increases, a counter-electromotive force proportional to the parasitic inductance of the wiring members $W2_A$ and $W2_B$ ($L2_A+L2_B$) is generated in the path P2, thereby disrupting the current flow through the path P2. Thus, the current flows more easily through the paths P3 and P4 than the path P2. When the current through the path P3 increases, a similar phenomenon occurs, and thus the current flows more easily through the path P4 than the path P3.

The counter-electromotive force generated in the paths P1-P4 decreases as the rate of change in the current flowing through the paths P1-P4 becomes lower. The counter-electromotive force in the paths P1-P4 becomes zero when the current flowing through the paths P1-P4 is made constant. During the steady state, an equal current flows through the paths P1-P4.

The wiring members for the paths may be formed, as described above, such that paths extending via Schottky barrier diodes that have a lower forward voltage applied thereto have a larger parasitic inductance, thereby causing a current flowing from the U terminal 32 to the P terminal 31 to be rapidly distributed between the paths P1-P4 connected in parallel, with the result that the current is suppressed from being concentrated on a certain path (e.g., path P1). Hence, abnormal heat generation or breakage of semiconductor elements such as the Schottky barrier diodes that could be caused by current concentration is prevented from occurring.

Similarly, the diodes SBD5-SBD8 are arranged such that diodes denoted by a symbol with a lower value have a lower forward voltage applied thereto, and the paths P5-P8 are arranged such that paths denoted by a symbol with a lower value have a larger parasitic inductance. Thus, as in the paths P1-P4, a current is rapidly distributed between the paths P5-P8, thereby suppressing the current from being concentrated on a certain path.

Suppressing abnormal heat generation of a certain semiconductor element that could be caused by current concentration allows a higher rated current to be set for the semiconductor module 1. Such an effect of suppressing current concentration can be more prominent as the number of diodes connected in parallel increases.

Figure 10:
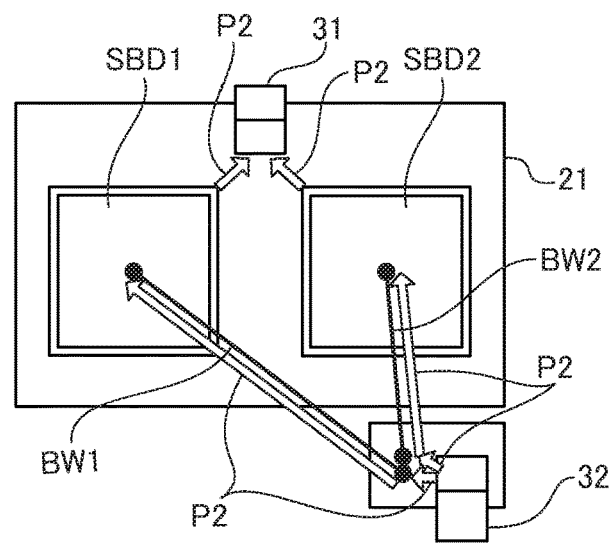
FIG. 10 conceptually illustrates relationships in length between bonding wires connecting a plurality of diodes connected in parallel to electrodes on a circuit board in an embodiment of the invention.

The following describes specific examples. FIG. 10 conceptually illustrates relationships in length between bonding wires connecting a plurality of diodes connected in parallel to electrodes on a circuit board. For convenience sake, only a relationship between the paths P1 and P2 is described with reference to this example.

In this example, the paths P1 and P2 satisfy only the condition (1) among the conditions (1)-(4). That is, the paths P1 and P2 in this example have the same configuration except that the total lengths of the bonding wires BW1 and BW2 are different. In other words, the parasitic inductances of the paths P1 and P2 are different because only of the difference in total length between the bonding wires BW1 and BW2.

Let "$I_1$" and "$I_2$" respectively be currents flowing through the paths P1 and P2, "$VF_1$" and "$VF_2$" respectively be forward voltages on the diodes SBD1 and SBD2, and "t" be time. In this case, satisfying the relationship expressed by the following formula (1) suppresses current concentration on the path P1.

$$VF_1+(L1_A+L1_B)dI_1/dt=VF_2+(L2_A+L2_B)dI_2/dt \quad (1)$$

Let X±Y (V: volt) be forward voltages based on the specification of the diodes SBD1 and SBD2, and X−Y (V) and X+Y (V) be the measured values. In this example, a current of α amperes (A) flows through the paths P1 and P2 for β, nanoseconds (ns). Substituting the exemplified values into the formula (1) provides the following formula (2). In addition, the formula (3) below is obtained from the following formula (2).

$$-2Y(V)=\{(L2_A+L2_B)-(L1_A+L1_B)\}\times\alpha(A)/\beta(ns) \quad (2)$$

$$(L1_A+L1_B)-(L2_A+L2_B)=2Y\beta/\alpha(\text{nanohenry}: nH) \quad (3)$$

Making the parasitic inductance of the path P1 ($L1_A+L1_B$) larger than the parasitic inductance of the path P2 ($L2_A+L2_B$) by $2Y\beta/\alpha$ (nH) as indicated by formula (3) suppresses current concentration on the path P1.

Assume, for example, that parasitic inductance ($L2_A+L2_B$) is 12 nH. In this case, the total length of the bonding wire BW2 is made less than that of the bonding wire BW1 by 10%. Thus, parasitic inductance ($L1_A+L1_B$) is larger than parasitic inductance ($L2_A+L2_B$) by 0.12 nH.

The numbers or positions of switching elements and diodes to be disposed on the layered substrate 2 in the embodiments described above are not limited to the abovementioned configurations and can be changed, as appropriate.

The number or layout of circuit boards to be disposed on the layered substrate 20 in the embodiments described above is not limited to the abovementioned configurations and can be changed, as appropriate.

In the embodiments described above, parasitic inductances are defined for all of the paths connected in parallel (in particular, the parasitic inductances of the paths P1-P4 (or P5-P8) go from larger to smaller in this order). However, simply defining parasitic inductances for at least two paths (e.g., making the parasitic inductance of the path P1 larger than that of the path P2) provides the effect of suppressing current concentration on a certain path.

In the embodiments described above, the parasitic inductance of a certain path of a diode is expressed by the sum of the inductance on the anode-electrode side (e.g., $L1_A$) and the inductance on the cathode-electrode side (e.g., $L1_B$). In this case, the anode-electrode-side inductance of a diode to which a low forward voltage is applied is preferably larger than the anode-electrode-side inductance of a diode to which a high forward voltage is applied. Thus, the magnitudes of the inductances of certain paths of diodes connected in parallel may be adjusted in accordance with the inductances on the anode-electrode sides. In other words, for example, the paths P1-P4 may be arranged such that the inductances $L1_B$-$L4_B$ of the wiring members $W1_B$-$W4_B$ electrically connected to the cathode electrodes become equal and the inductances $L1_A$-$L4_A$ of the wiring members $W1_A$-$W4_A$ electrically connected to the anode electrodes are such that inductances denoted by a symbol with a lower value become larger. This is because the anode electrodes are present on the surface side of the semiconductor module 1 and the inductances can be easily adjusted by changing the wiring lengths or the like of the bonding wires BW1-BW4. The inductances of the diodes may be adjusted not only by adjusting the wiring members on the anode-electrode side but also by adjusting the wiring members on the cathode-electrode side.

The switching elements MOS1-MOS4 also have a problem of current concentration on a certain switching element, as with the diodes SBD1-SBD4. In particular, when a plurality of switching elements are connected in parallel, a current is typically concentrated more on switching elements to which a lower ON voltage ($V_{ON}$) is applied.

In the embodiments described above, accordingly, the switching element to which the lowest ON voltage is applied is disposed as the switching element MOS1, and the other switching elements are disposed as the switching elements MOS2-MOS4 in ascending order of ON voltage. Thus, the switching elements MOS1-MOS4 are arranged such that switching elements denoted by a symbol with a lower value have a lower ON voltage applied thereto.

In the configuration in which the switching elements MOS1-MOS4 are disposed as described above, wiring members for paths P1'-P4' from the P terminal 31 via the switching elements MOS1-MOS4 to the U terminal 32 are formed such that paths extending via switching elements denoted by a symbol with a lower value have a larger parasitic inductance. Thus, a current is rapidly distributed between the paths P1'-P4', thereby suppressing the current from being concentrated on a certain path.

The switching elements MOS5-MOS8 may be arranged such that switching elements denoted by a symbol with a lower value have a lower ON voltage applied thereto. Meanwhile, paths P5'-P8' from the U terminal 32 via the switching elements MOS5-MOS8 to the N terminal 33 may be configured such that paths extending via switching elements denoted by a symbol with a lower value have a larger parasitic inductance. In this configuration, as in the case of the paths P1'-P4', a current is rapidly distributed between the paths P5'-P8', thereby suppressing the current from being concentrated on a certain path.

Accordingly, in order to suppress current concentration on a certain switching element, the semiconductor module 1 may be provided with an electronic circuit that includes a plurality of switching elements connected in parallel and including a first switching element (e.g., switching element MOS1) and a second switching element (e.g., switching element MOS2) that has applied thereto a higher ON voltage than the first switching element, wherein an inductance of a first path from a first terminal (e.g., P terminal 31) via the first switching element to a second terminal (e.g., U terminal 32) is larger than an inductance of a second path from the first terminal via the second switching element to the second terminal.

In the embodiments described above, the wiring members are formed such that paths denoted by a symbol with a lower value among the paths P1-P4 have a larger parasitic inductance. In other embodiments, inductance elements each having a different inductance (e.g., inductors with cores each having a different magnetic permeability) may be disposed in the paths P1-P4 such that paths denoted by a symbol with a lower value among the paths P1-P4 have a larger inductance.

Figure 11:
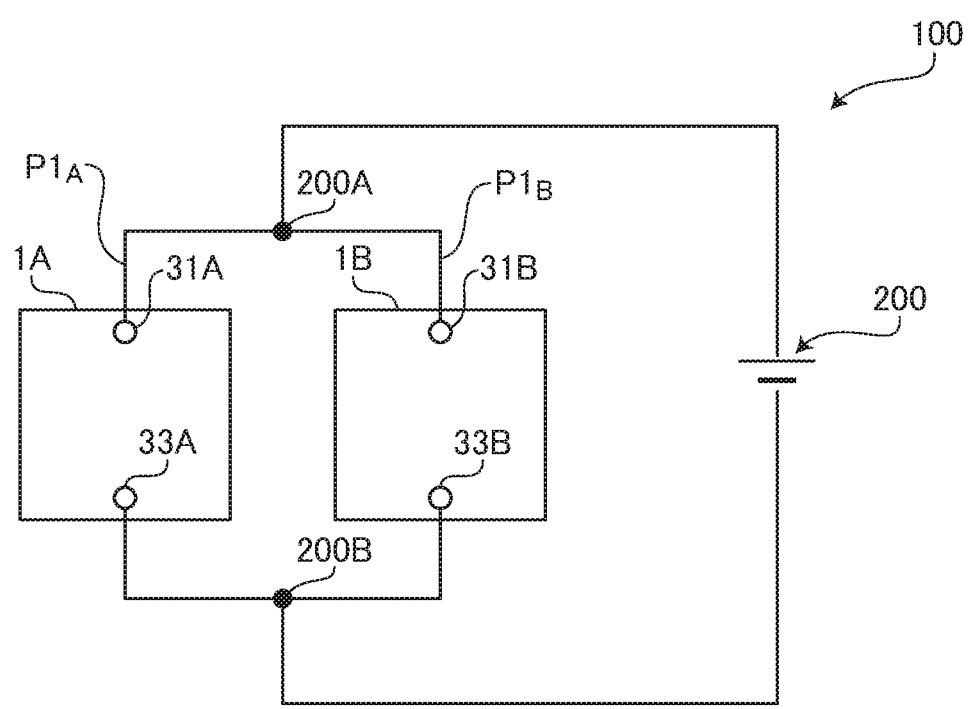
FIG. 11 schematically illustrates a semiconductor apparatus in accordance with an embodiment of the invention.

FIG. 11 schematically illustrates a semiconductor apparatus 100 in accordance with an embodiment of the invention. The semiconductor apparatus 100 includes semiconductor modules 1A and 1B connected in parallel. The semiconductor modules 1A and 1B have a similar configuration to the semiconductor module 1 in accordance with the embodiments described above. For convenience sake, FIG. 11 depicts the semiconductor module 1A using a block having a P terminal 31A and an N terminal 33A and depicts the semiconductor module 1B using a block having a P terminal 31B and an N terminal 33B.

The P terminals 31A and 31B are electrically connected to a positive potential point 200A on a positive-electrode side of a power supply 200 (one of a pair of terminals). The N terminals 33A and 33B are electrically connected to a negative potential point 200B on a negative-electrode side of the power supply 200 (another of the pair of terminals). Let symbol $P1_A$ denote a path from the positive potential point 200A via the semiconductor module 1A to the negative potential point 200B, and let symbol $P1_B$ denote a path from the positive potential point 200A via the semiconductor module 1B to the negative potential point 200B.

Both the forward voltage on the entirety of the semiconductor module 1A and the forward voltage on the entirety of the semiconductor module 1B exhibit variations. Hence, there will be a concern that a current may be concentrated on the semiconductor module to which a low forward voltage is applied. Accordingly, the semiconductor apparatus 100 is configured such paths extending via semiconductor modules to which a lower forward voltage is applied have a larger inductance.

In this example, the forward voltage on the semiconductor module 1A is lower than that on the semiconductor module 1B, and the parasitic inductance of the path $P1_A$ is larger than that of the path $P1_B$.

The current starts to flow through the path $P1_A$ having disposed therein the semiconductor module 1A to which a low forward voltage is applied. With a change (increase) in the current flowing through the path $P1_A$, a counter-electromotive force proportional to the parasitic inductance of the wiring member of the path $P1_A$ is generated in the path $P1_A$. The counter-electromotive force disrupts the current flow through the path $P1_A$. In other words, the current easily flows through the path $P1_B$. Thus, the current is rapidly distributed between the paths $P1_A$ and $P1_B$ connected in parallel, thereby suppressing current concentration on the path $P1_A$. In this example, accordingly, abnormal heat generation or breakage of semiconductor elements such as Schottky barrier diodes that could be caused by current concentration is prevented from occurring.

Although FIG. 11 depicts a semiconductor apparatus having two semiconductor modules connected in parallel, a semiconductor apparatus having three or more semiconductor modules connected in parallel also falls within the scope of the invention.

Embodiments and variations have been described, but other embodiments may be implemented by entirely or partially combining the embodiments and variations described above.

Embodiments are not limited to the above-described embodiments or variations, and various changes, replacements, or modifications may be made without departing from the gist of the technical idea. In addition, as long as the technical idea can be implemented in a different manner owing to technology progress or other derivative technologies, the invention may be implemented using such a method. Accordingly, the claims cover all aspects that can be included in the scope of the technical idea.

The following are an overview of features in the embodiments described above.

The electronic circuit indicated with reference to the above-described embodiments includes a plurality of diodes connected in parallel and including a first diode and a second diode that has applied thereto a higher forward voltage than the first diode, wherein an inductance of a first path from a first terminal via the first diode to a second terminal is larger than an inductance of a second path from the first terminal via the second diode to the second terminal.

The electronic circuit indicated with reference to the above-described embodiments is such that paths extending from the first terminal to the second terminal via the plurality of diodes are arranged such that paths extending via diodes that have a lower forward voltage applied thereto have a larger inductance.

The electronic circuit indicated with reference to the above-described embodiments is such that the inductances are inductances on anode sides.

The semiconductor module indicated with reference to the above-described embodiments is provided with an electronic circuit that includes a plurality of diodes connected in parallel and including a first diode and a second diode that has applied thereto a higher forward voltage than the first diode, wherein an inductance of a wiring member forming a first path from a first terminal via the first diode to a second terminal is larger than an inductance of a wiring member forming a second path from the first terminal via the second diode to the second terminal.

The semiconductor module indicated with reference to the above-described embodiments includes a substrate mounted with the electronic circuit, wherein the wiring member for the first path includes a first conductive wire disposed on the substrate and connecting the first or second terminal to the first diode, the wiring member for the second path includes a second conductive wire disposed on the substrate and connecting the first or second terminal to the second diode, and an inductance of the first conductive wire is larger than an inductance of the second conductive wire.

The semiconductor module indicated with reference to the above-described embodiments satisfies at least one of the following conditions (1) and (2):
(1) the first conductive wire has a greater total length than the second conductive wire; and
(2) the first conductive wire has a smaller cross-sectional area than the second conductive wire.

The semiconductor module indicated with reference to the above-described embodiments includes a substrate mounted with the electronic circuit, wherein the wiring member for the first path includes a first wiring pattern disposed on the substrate and connecting the first or second terminal to the first diode, the wiring member for the second path includes a second wiring pattern disposed on the substrate and connecting the first or second terminal to the second diode, and an inductance of the first wiring pattern is larger than an inductance of the second wiring pattern.

The semiconductor module indicated with reference to the above-described embodiments satisfies at least one of the following conditions (3) and (4):
(3) the first wiring pattern has a greater total length than the second wiring pattern; and
(4) the first wiring pattern has a smaller cross-sectional area than the second wiring pattern.

The semiconductor module indicated with reference to the above-described embodiments is such that the plurality of diodes have a same structure.

The semiconductor module indicated with reference to the above-described embodiments is such that the plurality of diodes are produced using silicon carbide (SiC).

The semiconductor module indicated with reference to the above-described embodiments includes a plurality of said semiconductor modules, the plurality of semiconductor modules being connected in parallel between a pair of terminals, wherein paths each extending from one to another of the pair of terminals via each of the plurality of semiconductor modules are such that paths extending via semiconductor modules that have a lower forward voltage applied thereto have a larger inductance.

The electronic circuit indicated with reference to the above-described embodiments is provided with a plurality of switching elements connected in parallel and including a first switching element and a second switching element that has applied thereto a higher ON voltage than the first switching element, wherein an inductance of a first path from a first terminal via the first switching element to a second terminal is larger than an inductance of a second path from the first terminal via the second switching element to the second terminal.

INDUSTRIAL APPLICABILITY

As described above, the present invention has the effect of suppressing a current from being concentrated on a certain semiconductor element among a plurality of semiconductor elements connected in parallel and can be useful especially for electronic circuits, semiconductor modules, and semiconductor apparatuses.

EXPLANATION OF THE CODES

1: Semiconductor module
2: Layered substrate
10: Base board
12: Case member
13, 14: Terminal member
20: Insulation layer
21: First circuit board
22: Second circuit board
23: Third circuit board
31: P terminal (Positive potential point)
32: U terminal (Intermediate potential point)
33: N terminal (Negative potential point)
BD1-BD8: Diode
BW1-BW8: Bonding wire
$L1_A$-$L8_A$, $L1_B$-$L8_B$: Inductance
MOS1-M0S8: Switching element
P1-P8: Path
SBD1-SBD8: Diode
T1-T8: Electrode
$W1_A$-$W8_A$, $W1_B$-$W8_B$: Wiring member

The invention claimed is:

1. An electronic circuit having a first terminal and a second terminal, the electronic circuit comprising:
a plurality of diodes having a same structure and connected in parallel, the plurality of diodes including a first diode and a second diode that respectively have applied thereto a first forward voltage and a second forward voltage, the second forward voltage being higher than the first forward voltage, wherein
a first path and a second path are formed from the first terminal, respectively via the first diode and the second diode, to the second terminal, each of the first and second terminals being connected to each of the first and second diodes by a conductive wire, and
an inductance of the first path is larger than an inductance of the second path.

2. The electronic circuit of claim 1, wherein
a plurality of paths are formed extending from the first terminal to the second terminal, respectively via the plurality of diodes, and
between any two of the plurality of diodes, of which one has a lower forward voltage than the other, the path extending via the one diode has a larger inductance than the path extending via the other diode.

3. The electronic circuit of claim 1, wherein
the inductance of each of the first and second paths is an inductance on an anode side of said each path.

4. A semiconductor module having a first terminal and a second terminal, comprising:
an electronic circuit that includes a plurality of diodes having a same structure and connected in parallel, the plurality of diodes including a first diode and a second diode that respectively have applied thereto a first forward voltage and a second forward voltage, the second forward voltage being higher than the first forward voltage,
a first wiring member forming a first path from the first terminal via the first diode to the second terminal, and
a second wiring member forming a second path from the first terminal via the second diode to the second terminal, an inductance of the first wiring member being larger than that of the second wiring member, wherein
each of the first and second terminals is connected to the first diode by a conductive wire, which is a first conductive wire and is included in the first wiring member, and
each of the first and second terminals is connected to the second diode by another conductive wire, which is a second conductive wire and is included in the second wiring member.

5. The semiconductor module of claim 4, comprising:
a substrate on which the electronic circuit is mounted, wherein
each of the first conductive wire and the second conductive wire is disposed on the substrate, and
an inductance of the first conductive wire is larger than an inductance of the second conductive wire.

6. The semiconductor module of claim 5, satisfying at least one of the following conditions (1) and (2):
(1) the first conductive wire has a greater total length than the second conductive wire; and
(2) the first conductive wire has a smaller cross-sectional area than the second conductive wire.

7. The semiconductor module of claim 5, wherein each of the first conductive wire and the second conductive wire is a wiring pattern.

8. The semiconductor module of claim 7, satisfying at least one of the following conditions (3) and (4):
(3) the first wiring wire has a greater total length than the second wiring wire; and
(4) the first wiring wire has a smaller cross-sectional area than the second wiring wire.

9. The semiconductor module of claim 4, wherein
the plurality of diodes are made of silicon carbide (SiC).

10. A semiconductor module comprising:
a plurality of said semiconductor modules of claim 4, connected in parallel between a pair of terminals, wherein
a plurality of paths extending from one to the other of the pair of terminals, respectively via the plurality of semiconductor modules, and
between any two of the plurality of said semiconductor modules, of which one has a lower forward voltage applied thereto than the other, the path extending via the one semiconductor modules has a larger inductance than the path extending via the other semiconductor module.

11. An electronic circuit having a first terminal and a second terminal, the electronic circuit comprising:
a plurality of switching elements connected in parallel, the plurality of switching elements including a first switching element and a second switching element that respectively have applied thereto a first ON voltage and a second ON voltage, the second On volrage being higher than the first ON voltage, wherein
a first path and a second path are formed from the first terminal, respectively via the first and second switching elements, to the second terminal, and
an inductance of the first path is larger than an inductance of the second path.

* * * * *